United States Patent
Geddes et al.

(10) Patent No.: US 6,208,214 B1
(45) Date of Patent: Mar. 27, 2001

(54) MULTIFUNCTION HIGH FREQUENCY INTEGRATED CIRCUIT STRUCTURE

(75) Inventors: John J. Geddes; Stephanie M. Carlson, both of Minneapolis; Philip Cheung, Roseville; Vladimir Sokolov, Shakopee, all of MN (US)

(73) Assignee: TLC Precision Wafer Technology, Inc., Minneapolis, MN (US)

( * ) Notice: Subject to any disclaimer, the term of this patent is extended or adjusted under 35 U.S.C. 154(b) by 0 days.

(21) Appl. No.: 09/499,077

(22) Filed: Feb. 4, 2000

(51) Int. Cl.[7] ................ H03B 5/18; H04B 1/28

(52) U.S. Cl. ................ 331/96; 331/117 FE; 331/117 D; 331/108 C; 331/172; 331/175; 331/177 R; 455/319; 455/325; 455/327; 455/333

(58) Field of Search ................ 331/96, 117 R, 331/117 FE, 117 D, 107 DP, 107 SL, 108 C, 108 D, 172, 175, 177 R; 455/318, 319, 325, 327, 333

(56) References Cited

U.S. PATENT DOCUMENTS 5,546,056 * 8/1996 Tokumitsu ................ 331/172

* cited by examiner

Primary Examiner—David Mis
(74) Attorney, Agent, or Firm—Roger W. Jensen

(57) ABSTRACT

A multifunction high frequency integrated circuit structure and circuit configuration includes a resonator or oscillator circuit coupled to a buffer amplifier by way of a stripline coupler. The resonator circuit includes an input terminating region which is coupled to three input terminating ports. A first one of the input terminating ports is coupled directly to the resonator for either being electrically connected to a selected signal source or load, a second one of the input terminating ports is electrically connected to either a fixed or variable potential source, and the remaining input terminating port is coupled to the resonator input terminating region through another stripline coupler, and is intended to be electrically connected to another selected signal source. Depending upon the choice of circuit components and signal sources connected to the input terminating ports, the multifunction high frequency integrated circuit may serve as a voltage controlled oscillator, low phase noise oscillator, direct up/down frequency signal converter, or injection locked oscillator.

9 Claims, 9 Drawing Sheets

MULTIFUNCTION HIGH FREQUENCY INTEGRATED CIRCUIT STRUCTURE

FIELD OF THE INVENTION

The present invention relates generally to integrated circuits for millimeter-wave and microwave applications, and more particularly to a common circuit configuration which may be utilized to provide a variety of high frequency signal functions depending upon external components coupled thereto.

BACKGROUND OF THE INVENTION

The present invention generally relates to high-frequency circuit devices, and more particularly to millimeter-wave and microwave devices. State-of-the-are integrated circuit fabrication technology which permits low cost and low noise fabrication of such devices is commonly referred to as MMIC technology, and generally refers to both monolithic and hybrid manufacture processing techniques.

MMIC high frequency devices useful in the telecommunication and radar arts include among others, basic oscillators, voltage-controlled oscillators, mixers and converters, as well as injection locked signal sources having power greater than the injected signal. Each of the aforementioned high frequency devices is well known in the art and are embodied in wide array of circuit configurations employing a wide variety of circuit components including field effect transistors, varactors, diodes, and the like.

As is customary in MMIC technology, a new design configuration is elected for each new application. This of course adds both costs and time delays in program development. Thus there is a need for a common circuit module which performs a selected high frequency circuit function depending upon external components and/or one or more signal sources connected thereto.

SUMMARY OF THE INVENTION

An object of the present invention is to provide a multifunction integrated circuit module for communication applications, which is easily fabricated in accordance with MMIC hybrid or integrated circuit fabrication techniques.

Another object of the present invention is to provide a multifunction integrated circuit module which serves as a baseline circuit configuration, and which may be employed as a selected high frequency device serving a particular high frequency circuit function depending upon external components connected thereto.

In accordance with the present invention, a multifunction high frequency integrated circuit structure and circuit configuration includes an oscillator circuit coupled to a buffer amplifier by way of a stripline coupler. The oscillator circuit includes an input-terminating region which is coupled to three input terminating ports. A first one of the input terminating ports is coupled directly to the resonator for either being electrically connected to a selected signal source or load, a second one of the input terminating ports is electrically connected to either a fixed or variable potential source, and the remaining input terminating port is coupled to the resonator input terminating region through another stripline coupler, and is intended to be electrically connected to another selected signal source. Depending upon the choice of circuit components and signal sources connected to the input terminating ports, the multifunction high frequency integrated circuit may serve as a voltage controlled oscillator, low phase noise oscillator, direct up or down frequency signal converter, or injection locked oscillator, among others.

DETAILED DESCRIPTION OF THE INVENTION

Figure 1:
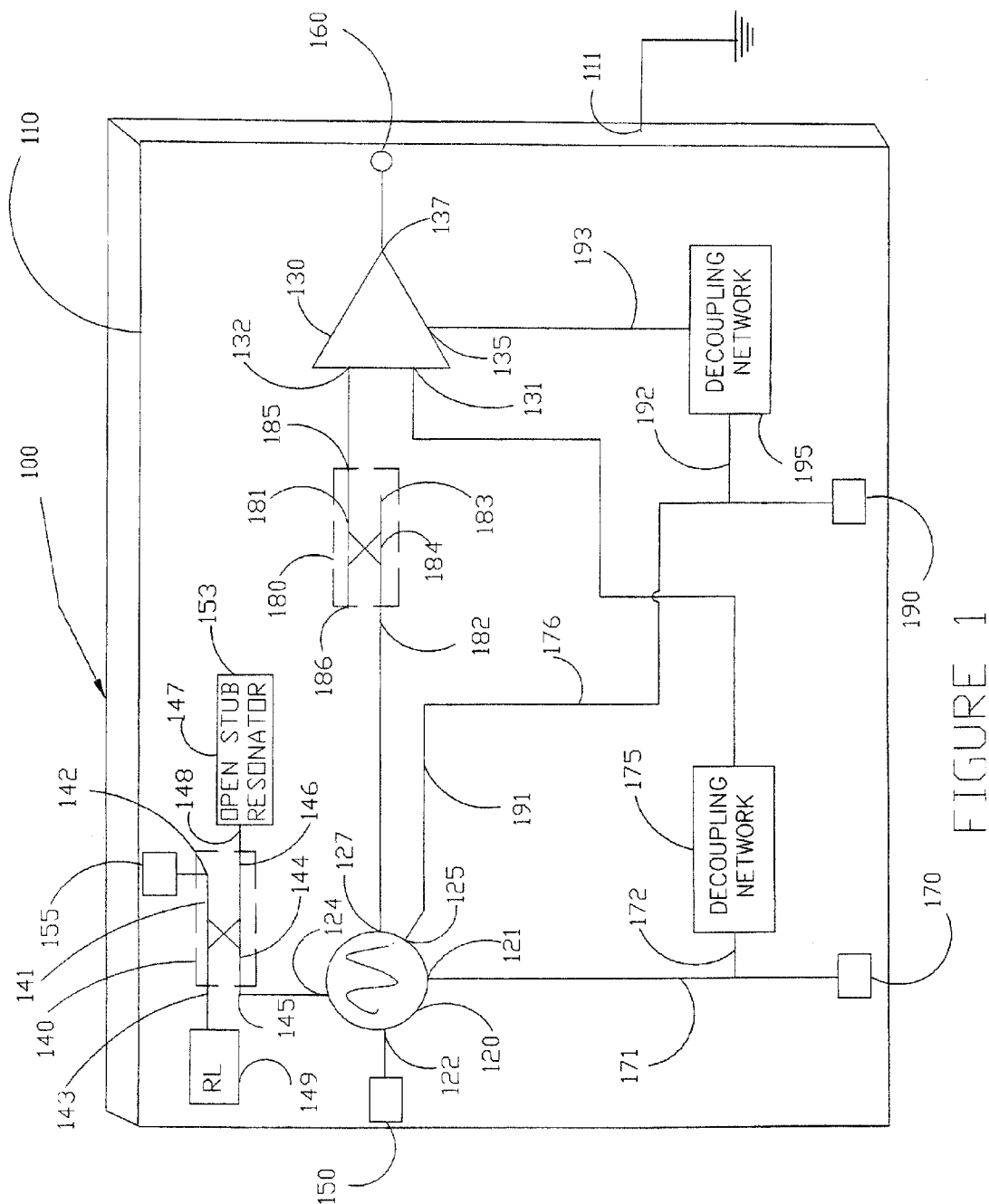
FIG. 1 is a block diagram of multifunction oscillator circuit in accordance with the present invention.

Illustrated in FIG. 1 is a partial schematic block diagram of the multifunction high frequency integrated circuit 100 of the present invention including a substrate 110 and a ground plane generally indicated by numeral 111. Fabricated on substrate 110 is an oscillator component 120, a buffer amplifier circuit 130, a first transmission line strip coupler 140 including a mechanically tunable open stub resonator 147, and second transmission line strip coupler 180. Oscillator component 120 functions as a negative resistance in the oscillator circuit. Integrated circuit 100 further includes signal receiving terminal ports 150 and 155, an output port 160, and first and second bias ports 170 and 190 for receiving first and second bias potential sources, respectively.

Integrated circuit 100 is so constructed such that bias port 170 is electrically coupled to a control terminating input means 121 of oscillator component 120, and is also electrically coupled to a control terminating input means 131 of buffer amplifier 130 through a series decoupling network 175. Further, bias port 190 is electrically coupled to a bias terminating input means 125 of oscillator component 120, and also to a bias terminating input means 135 of buffer amplifier 130 through a series decoupling network 195. Output port 160 is electrically coupled to output terminating means 137 of buffer amplifier 130. Signal receiving terminal port 150 is directly coupled to signal input terminating means 122 of oscillator component 120, and signal receiving port 155 is coupled to another signal input terminating means 124 of oscillator component 120 by way of stripline coupler 140. Output terminating means 127 of oscillator component 120 is electrically coupled to a signal input means 132 of amplifier 130 by way of stripline coupler 180.

Stripline coupler 140 includes first and second transmission line segments 141 and 144. Transmission line segment 141 includes a first terminating end 142 electrically connected to terminating port 155, and an opposite end 143 thereof being electrically connected to the ground plane 111 through a series resistor circuit 149. Transmission line segment 144 includes a first terminating end 145 electrically connected to signal input terminating means 124 of oscillator component 120, and opposite end 146 thereof electrically connected to one terminating end 148 of mechanically tunable open stub resonator 147, opposing other end 153 thereof being open.

Stripline coupler 180 includes first and second transmission line segment 181 and 184. Transmission line segment 184 includes a first terminating end 182 electrically connected to signal output means 127 of oscillator component 120, and an opposite end 183 thereof being open. Transmission line segment 181 includes a first terminating end 185 electrically connected to signal input means 132 of amplifier 130, and an opposite end 186 thereof being open.

Figure 4:
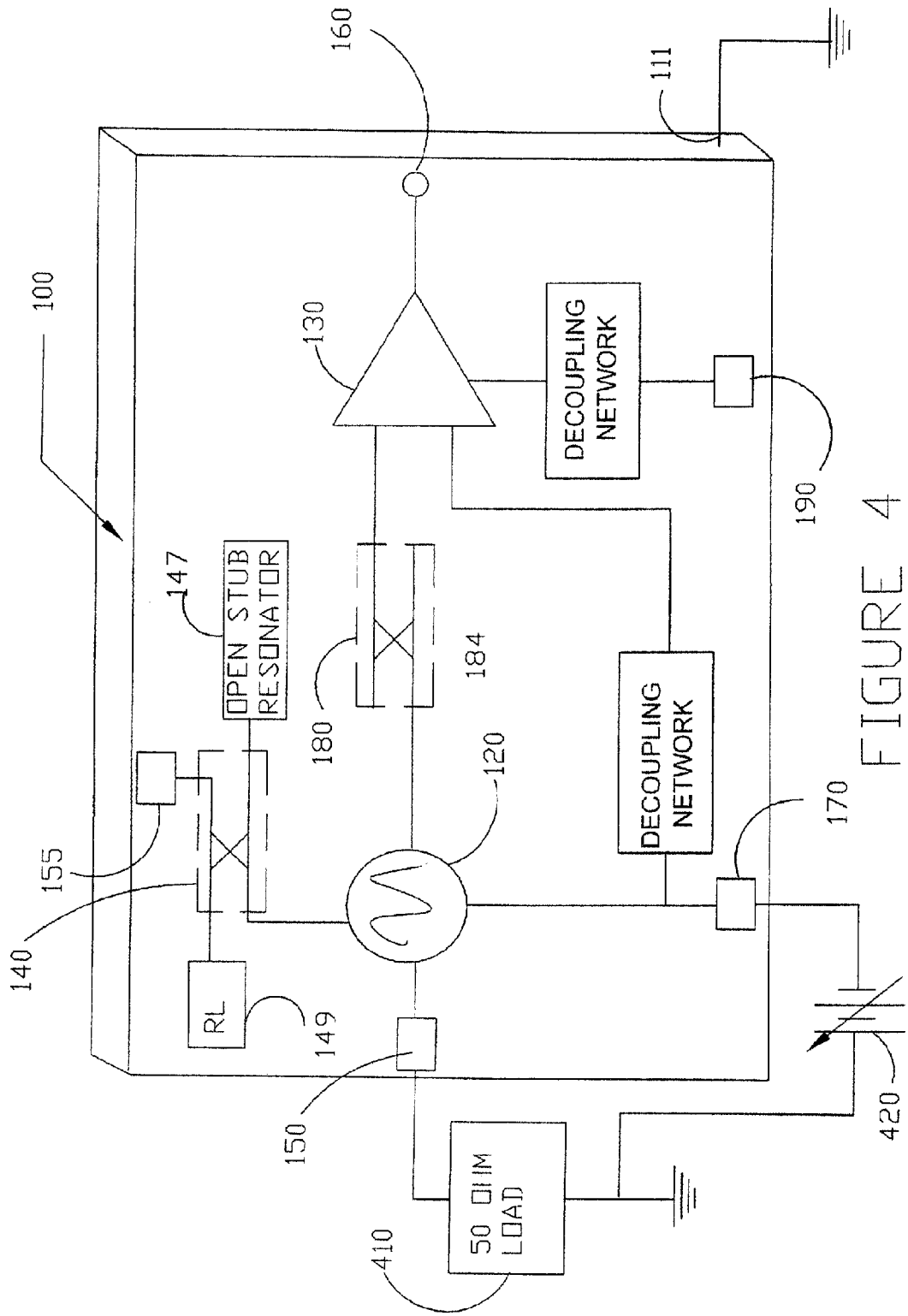
FIG. 4 is a block diagram of a voltage-controlled oscillator employing the multifunction oscillator of the present invention.
Figure 6:
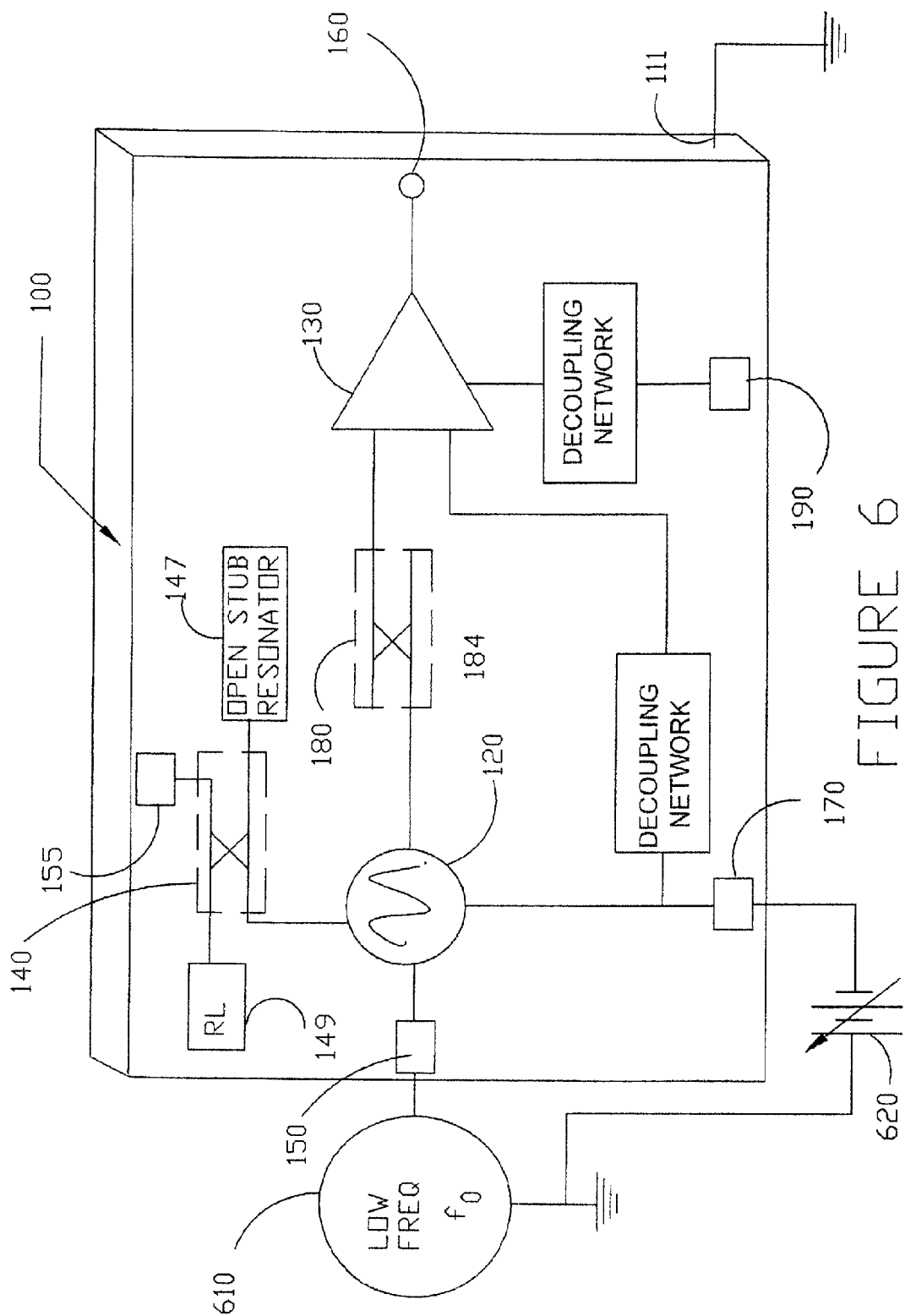
FIG. 6 is a block diagram of a harmonic frequency multiplier employing is the multifunction oscillator of the present invention.

The simple structure of the multifunction high frequency integrated circuit 100 of the present invention as just described may be utilized to serve a variety of high frequency functions by way of selective signal sources and/or component connections. More specifically, integrated circuit 100 serves as a high frequency voltage-controlled-oscillator by simply coupling a terminating resistive load to input port 150 as depicted in FIG. 4, and a variable bias potential source coupled to bias port 170 as depicted in FIG. 4. Coupling a high Q resonance cavity between the resistive load and the signal receiving input port 150, integrated circuit 100 may serve as a low-phase-noise signal source as depicted in FIG. 6.

In other embodiments, with selected frequency signal sources applied at either signal receiving input port 150 and/or signal receiving input port 155, integrated circuit 100 may serve as a harmonic frequency multiplier, an injection locked oscillator, or a direct and sub-harmonic up or down signal frequency converter as will be more fully described below and depicted in FIGS. 6, 7, 8, and 9, respectively.

Figure 2:
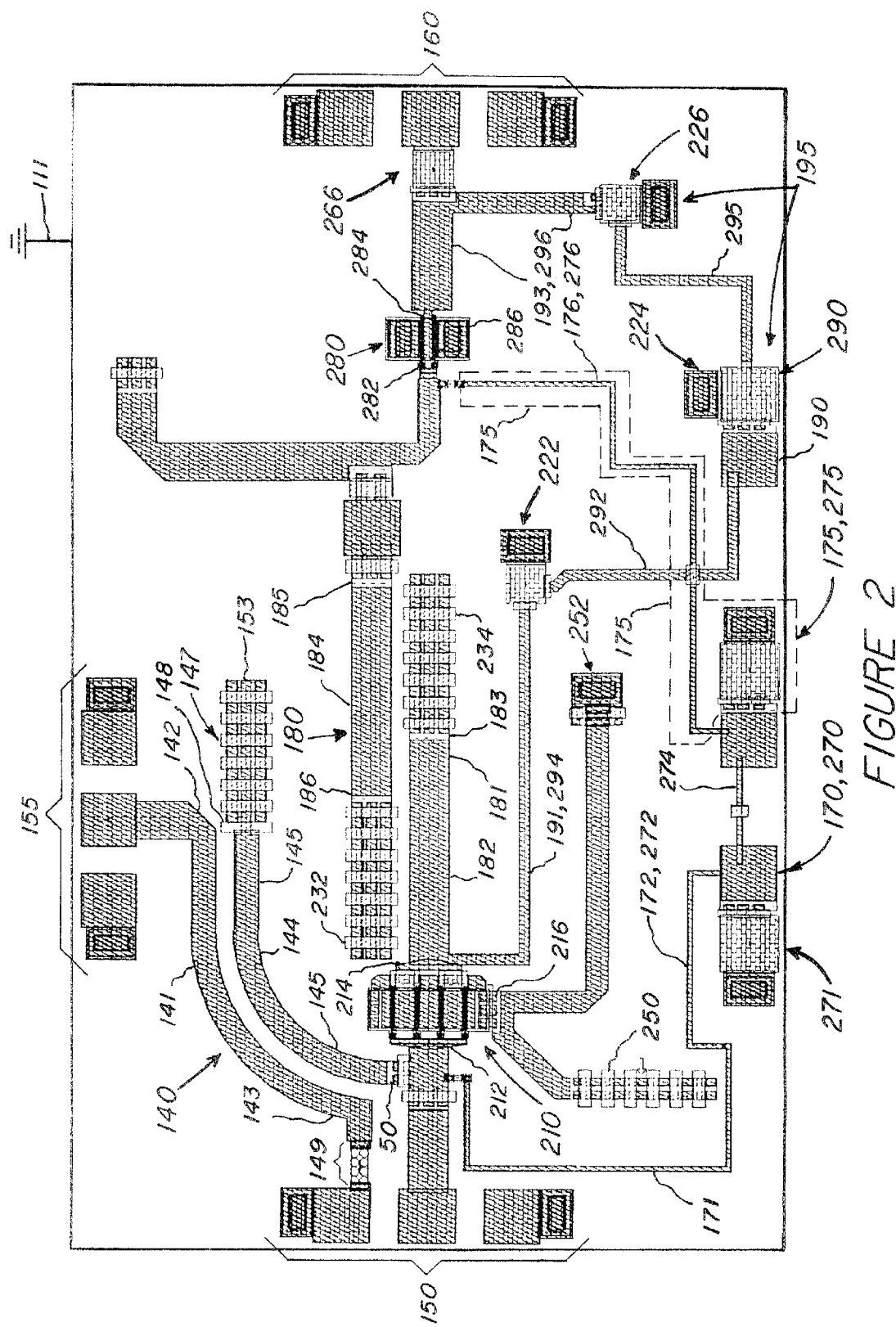
FIG. 2 is a plan view of a MMIC layout of a multifunction oscillator in accordance with the present invention.

FIG. 2 is a plan view of an exemplary embodiment of the multifunction integrated circuit 100 in accordance with the present invention. Integrated circuit 100 is preferably constructed in accordance with common practices associated with MMIC technology particularly suited for microwave and mm-wave signal applications. Components in FIG. 2 corresponding to like components illustrated in FIG. 1 have retained the same numeral designations.

As illustrated in FIG. 2, each of the signal receiving terminal ports 150 and 155, and output port 160 is constructed by way of a three-pad co-planar structure. The center pad is intended for the primary input or output signal, and the outside pads are intended primarily for test purposes. More specifically, each outside pad is intended to include a fabricated "via" to an integrated circuit conductor plate, identified by numeral 111, utilized as a ground plane, as is customary in MMIC fabrication technology.

Oscillator component 120 is generally constructed by way of a field effect transistor 210 fabricated on substrate 110, and includes a gate coupled to a gate terminating region 212, a drain coupled to a drain terminating region 214, and a source coupled to a source terminating region 216. As is customary in MMIC integrated circuit fabrication techniques, a field effect transistor chip is appropriately integrated into substrate 110 with connections to corresponding ones of the latter mentioned terminating regions.

In like manner, buffer amplifier 130 is generally constructed by way of a field effect transistor 280 fabricated on substrate 110, and includes a gate coupled to a gate terminating region 282, a drain coupled to a drain terminating region 284, and a source coupled to a source terminating region 286, which is an electrical through connection (via) to ground plane 111.

A connection pad 270 serves as bias input port 170 which is electrically connected to gate terminating region 212 by way of a transmission line 272 having a selected characteristic impedance value. Connection pad 270 is also electrically connected to gate terminating region 282 by way of conductance path 274 and transmission line 276, having a particular resistance and characteristic impedance value, respectively. Coupled to the juncture of conductance path 274 and transmission line 276 is a metal-insulator-metal (MIM) capacitor fabricated on substrate 110, which is connected to ground plane 111 through a via, and is generally indicated by numeral 275 and, in conjunction with transmission line 176 serves as a high frequency signal decoupling network 175. Similarly, network 271, in conjunction with transmission line 171, may also be fabricated on substrate 110 directly coupled to pad 270.

Similarly, connection pad 290 serves as bias input port 190 when electrically connected to drain terminating region 214 by way of series conductor 292 and transmission line 294, and to drain terminating region 284 by way of conductor 295 and transmission fine 296. A plurality of capacitors and vias (constituting shunt capacitors to ground) and their respective transmission lines 222, 224, 226, and 271 are also fabricated on substrate 110, serving as signal decoupling networks between the oscillator component 120 and buffer amplifier circuit 130. The location of these capacitor/via structures is, of course, dependent upon the actual layout of the integrated circuit, including specific lengths for the transmission lines. As illustrated, shunt capacitance 222 is electrically connected at the juncture of transmission lines 292 and 294; shunt capacitance 224 is electrically connected at the juncture of transmission lines 292 and 295; shunt capacitance 226 is electrically connected at the juncture of transmission lines 295 and 296; and shunt capacitance 271 is electrically connected at the juncture of transmission line 171 and pad 270.

As is further illustrated on FIG. 2, source terminating region 216 of transistor 210, which forms part of an oscillator circuit, is electrically connected to a tunable, open-circuited stub resonator 250. Further, source terminating region 216 is also electrically connected to a shunt resistor to ground (by way of a via) generally indicated by numeral 252. Elements 250 and 252 provide a feedback function that creates a negative resistance for the oscillator circuit. As further illustrated in FIG. 2, cheater stubs 232, 234, 147 and 250, associated with line segments 184, 182, 145 and 211 respectively, are provided for optimum tuning of the oscillator circuit. These stubs are provided to compensate for parasitic effects resulting from the chosen fabrication layout, as well as fabrication variations.

Also fabricated on substrate 110 is a decoupling capacitor 266 electrically connected between the drain terminating region 284 and output port 160 as is customary for a MMIC circuit.

Figure 3:
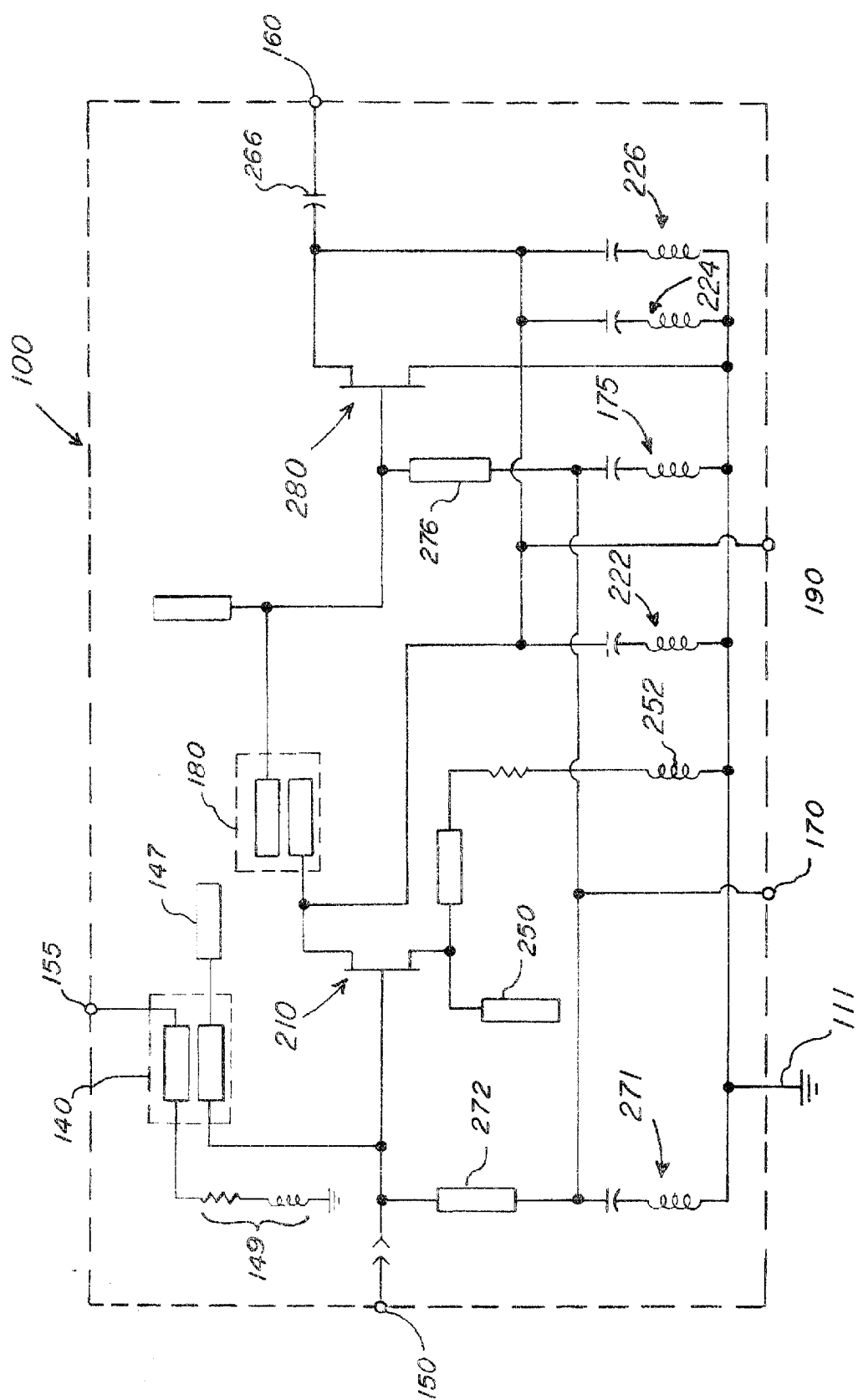
FIG. 3 is a schematic circuit diagram illustrating an equivalent circuit of a multifunction oscillator in accordance with the present invention.

FIG. 3 is a schematic circuit diagram illustrating an equivalent circuit of a multifunction integrated circuit 100 in accordance with the present invention. Integrated circuit 100 is preferably constructed in accordance with common practices associated with MMIC technology particularly suited for microwave and mm-wave signal applications. Components in FIG. 3 corresponding to like components illustrated in FIGS. 1 and 2 have retained the same numeral designations.

FIGS. 4–8 are schematic block diagrams illustrating employment of the multifunction high frequency integrated circuit structure 100 of the present invention so as to achieve several different high frequency circuit functions. Before proceeding, an exemplary embodiment of the integrated circuit structure 100 may have nominal circuit component values as follows: transmission lines 272 and 276 having characteristic impedance values on the order of 75 ohms; resistance of series resistor 149 being on the order of 50 ohms, with the value of the via inductance being on the order of 0.02 nano-henrys; each of the shunt capacitors 175, 222, 224, 226, and 271; having component values of approximately 1–2 pico-farads, with via inductance of approximately 0.02 nano-henrys; and the shunt capacitor/via combination 252 having component values of about 10 ohms and 0.02 nano-henrys, respectively.

As should be clearly understood, each of the field effect transistors 210 and 280 is intended to be operated with a selected drain bias in accordance with the particular characteristic of the selected field effect transistor components. Accordingly, a potential source (not shown) is intended to be applied between bias port 190 and ground, and is commonly in the order of 3 volts DC; this same arrangement is used for the other embodiments to be discussed below.

In the preferred embodiment of the invention, mechanically tunable open stub resonator 147 is intended to be fabricated on substrate 100 by way of "air bridge" technology. Accordingly, the oscillation frequency of the stand-alone-oscillator is intended to be in the order of 34 GHz. These air bridges may be mechanically cut at the time of manufacture to adjust the frequency of oscillation in the usual manner as in customary in MMIC fabrication technology. Preferably the mechanically tunable open stub resonator 147 is fabricated so as to nominally produce an oscillation near 34 GHz, such that the desired stand-alone oscillation frequency may be adjusted in the range of 34.0 GHz to greater than 40 GHz by simply cutting away portions of the stub resonator 147.

FIG. 4 illustrates a voltage controlled oscillator. An external load resistance 410 of appropriate value is electrically connected between signal receiving terminal port 150 and electrical ground plane 111, hereafter referred herein as simply ground. Further, a variable potential source 420 is electrically connected between bias port 170 and ground. In this circuit configuration of the multifunction integrated circuit structure 100, the circuit functions as a voltage controlled oscillator with the variable potential sources serving as a variable frequency control voltage since it is electrically applied to the gate 212 of field effect transistor 210. In an exemplary embodiment of the voltage controlled oscillator configuration, the variable potential source 420 may in the range of 0.0 to −3.0 volts. Further, in the embodiments which follow, the mechanically tunable open stub resonator 147 is intended to be altered so as to achieve the desired stand-alone oscillation frequency, namely, in the range of 34.0 GHz to greater than 40 GHz. Accordingly, a change in gate voltage from 0.0 to −3.0 volts results in a change in output signal frequency of about 400 MHz.

Figure 5:
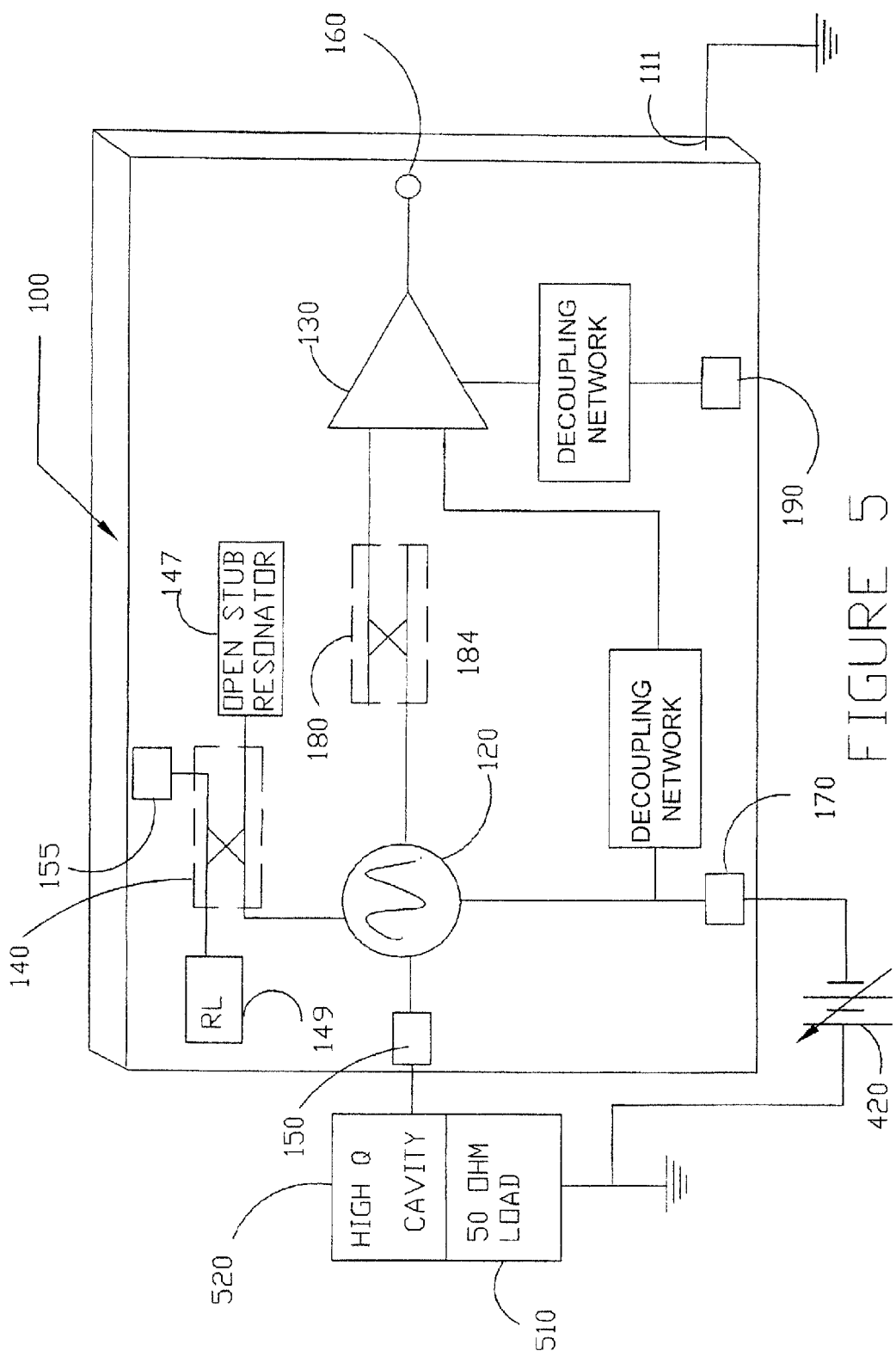
FIG. 5 is a block diagram of a low phase noise oscillator employing the multifunction oscillator of the present invention.

FIG. 5 illustrates a low phase noise oscillator. Preferably an external 50 ohm terminating resistance 510 is electrically connected to terminal port 150 through a transmission line which is coupled to an external high Q resonance cavity. In this configuration, on-chip resonator 144 is disconnected from oscillator component 120 by cutting the air bridge 50 at the base of on-chip resonator 144. Like FIG. 4, a variable potential source 420 is electrically connected between bias port 170 and ground. In this circuit configuration of multifunction integrated circuit structure 100, the circuit functions as a voltage controlled oscillator with very low phase noise in which the variable potential source 420 may serve as a limited variable frequency control voltage, albeit over a smaller frequency range than is the case of the circuit of FIG. 4.

FIG. 6 illustrates a harmonic frequency multiplier signal source. Preferably a frequency signal source 610 is electrically connected between signal receiving terminal port 150 and ground. A variable potential source 620 is electrically connected between bias port 170 and ground so as to maximize the conversion gain between the input signal and the output signal at the harmonic frequency. In this circuit configuration of multifunction integrated circuit structure 100, the circuit functions as a harmonic frequency multiplier where the output frequency tuning range is controlled by the input signal source. The frequency of the output signal of the circuit configuration of FIG. 6 may be mathematically described by $f_{out}=nf_o$, where $f_o$ equals the input frequency, and n=1, 2, 3 . . . .

Figure 7:
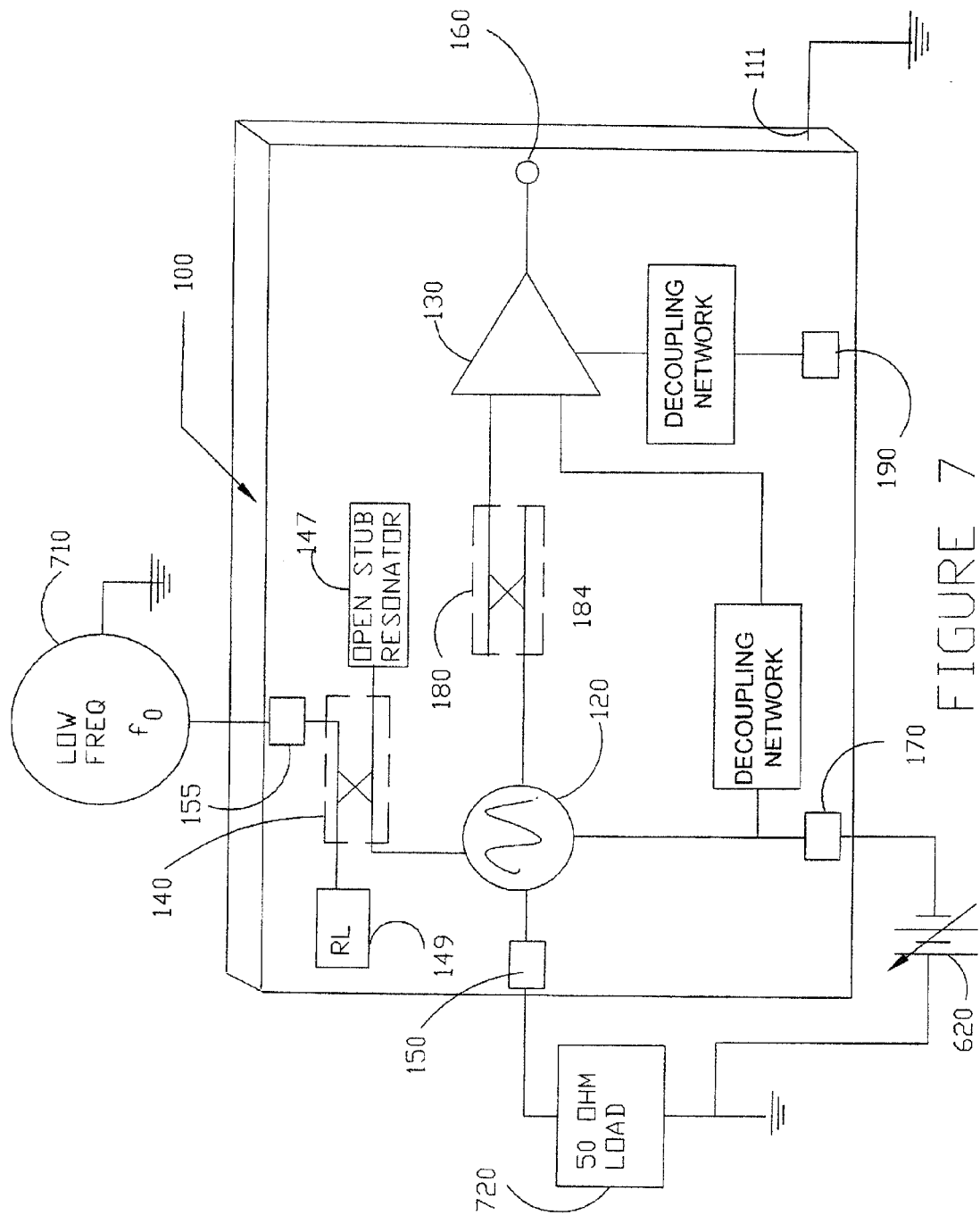
FIG. 7 is a block diagram of an injection locked oscillator employing the multifunction oscillator of the present invention.

FIG. 7 illustrates an injection locked oscillator. Preferably, a low power signal source 710 is electrically connected between signal receiving terminal port 155 and ground. A potential source 620 is electrically connected between bias port 170 and ground so as to maximize the gain between the injected signal and the output signal. In this circuit configuration of multifunction integrated circuit structure 100, the circuit functions as an injection locked oscillator. When a signal is injected into signal receiving port 155 and applied to the gate of field effect transistor 210 by means of coupler 140/144, the circuit output port 160 will exhibit the same signal as (or is locked to) the injected signal at port 155, in both phase and frequency, but with higher power as determined by the gain of buffer amplifier 130. Furthermore, as the injected signal frequency is changed, the output frequency will follow accordingly.

The circuit configuration of FIG. 7 is such that higher input power of the injected signal permits a wider locked operating frequency range in the order of 400 MHz for signal source 710 input power in the range of 10 milliwatts. Of course, as before, optimization of the output power also may be achieved again by mechanically tuning the open stub resonator 147.

Figure 8:
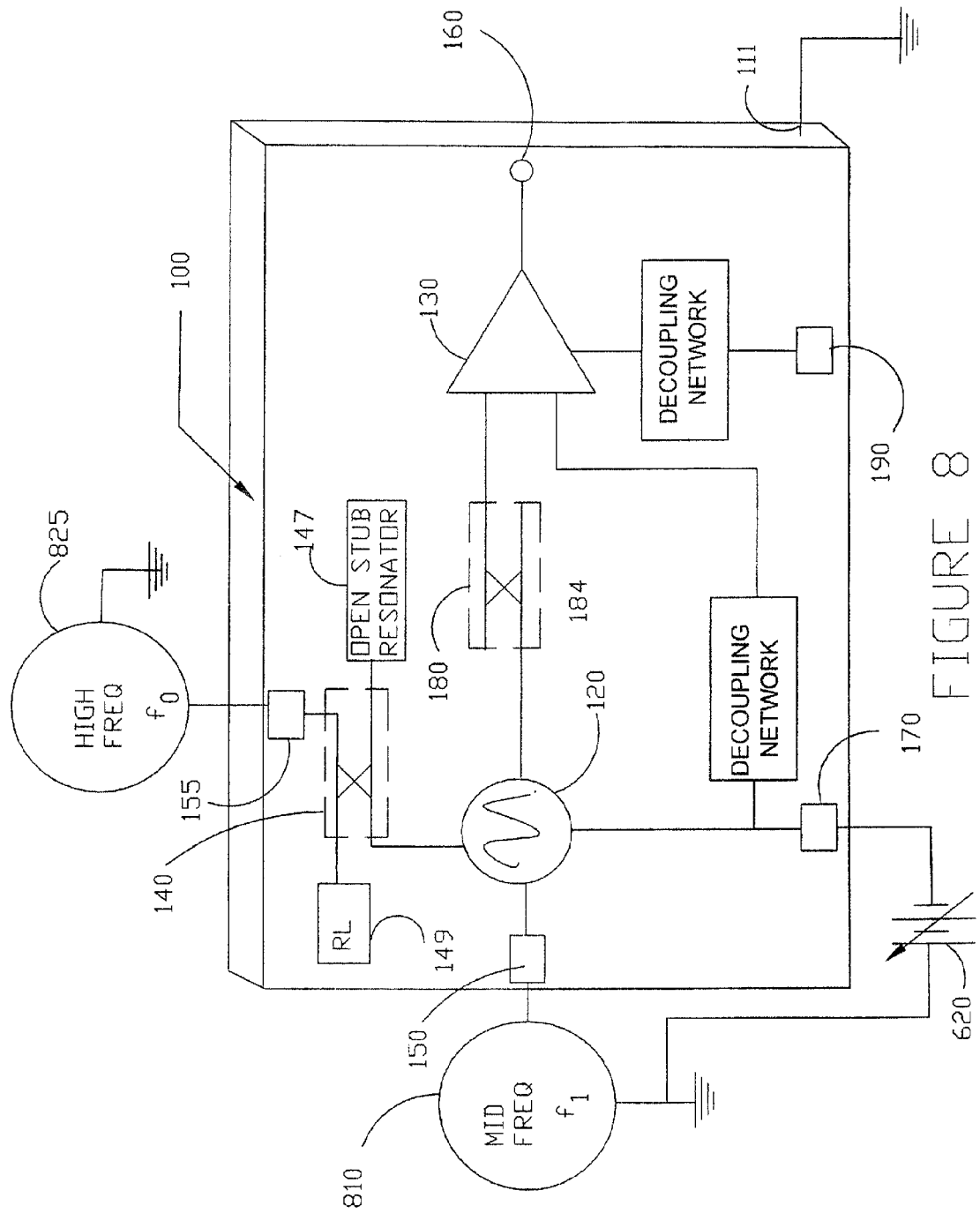
FIG. 8 is a block diagram of a sub-harmonic up frequency converter employing the multifunction oscillator of the present invention.

FIG. 8 illustrates a direct and sub-harmonic up-converter and signal mixing circuit. Preferably, an intermediate frequency signal source 810 having frequency "$f_1$" is electrically connected between signal receiving terminal port 150 and ground, and a local oscillator signal source 825 having frequency "$f_0$" is electrically connected between signal receiving terminal port 155 and ground. As before, a variable potential source 620 is electrically connected between bias port 170 and ground so as to maximize the gain from signal source 810 to the output signal at 150. For this configuration (and that of FIG. 9), the potential source applied between bias port 190 and ground is zero.

In this circuit configuration of multifunction integrated circuit structure 100, the circuit functions as a direct or sub-harmonic up converter for signal mixing. When a high frequency signal source serves as the local oscillator signal source 825 and is injected into the terminal port 155, the output port 160 will serve in a capacity as an injection locked oscillator similar to that of FIG. 7. However, with the additional intermediate frequency signal source 910, the circuit structure of integrated circuit 100 will serve as an up-converter signal mixer such that the output signal at port 160 will have the following signal frequency components:

$m*f_0+n*f_1$ where $m=1,2,3, \ldots$ and where $n=0,1,2,3, \ldots$
As before, the circuit configuration of FIG. 8 is such that the output power may be optimized by mechanically tuning the open stub resonator 147.

Figure 9:
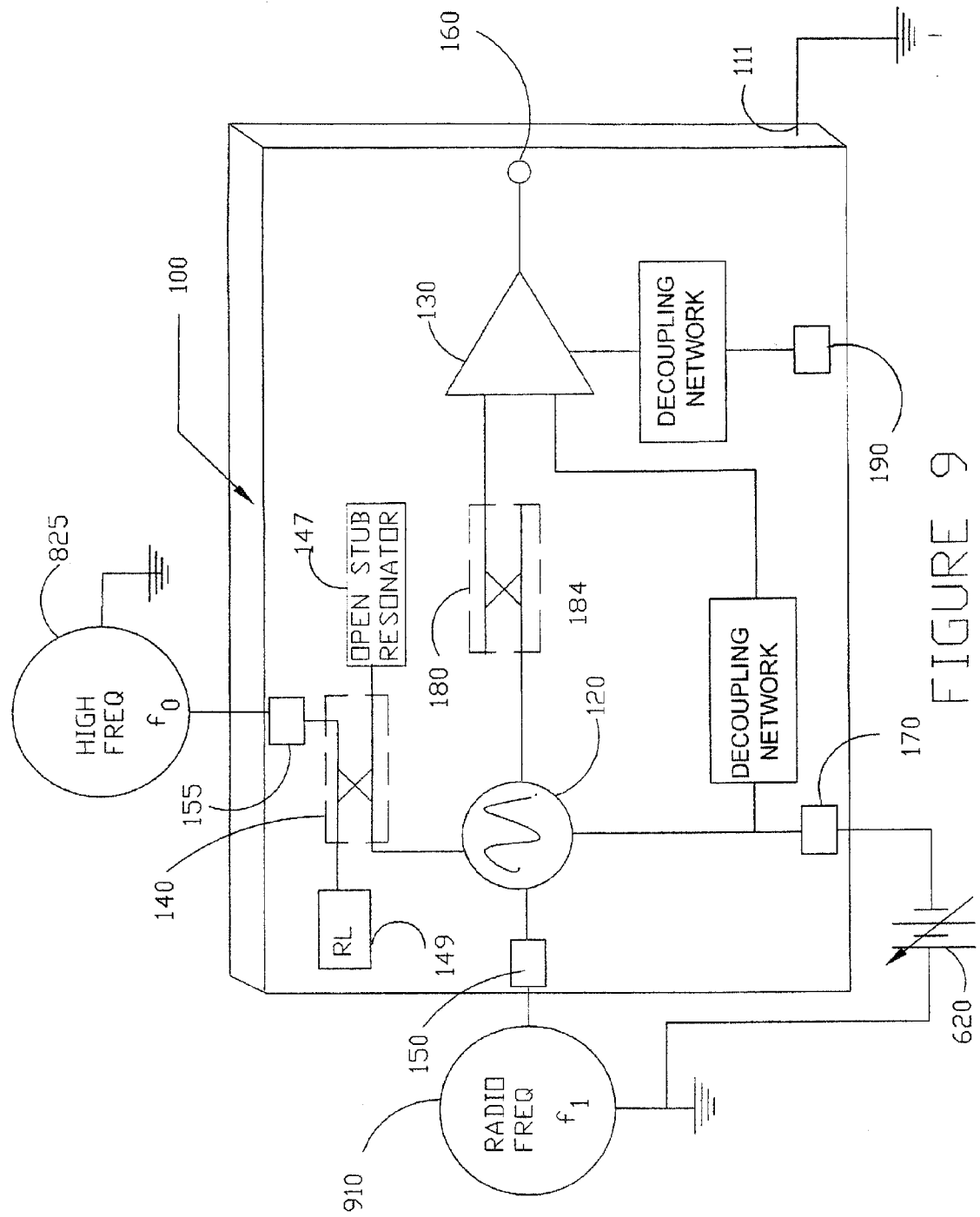
FIG. 9 is a block diagram of a sub-harmonic down frequency converter employing the multifunction oscillator of the present invention.

FIG. 9 illustrates a direct and sub-harmonic down-converter and signal mixing circuit. Preferably, a high (radio) frequency signal source 910 having frequency "$f_1$" is electrically connected between signal receiving terminal port 150 and ground, and another high frequency local oscillator signal source 825 having frequency "$f_0$" is electrically connected between signal receiving terminal port 155 and ground. As before, a potential source 620 is electrically connected between bias port 170 and ground so as to nominally operate the field effect transistor in the conductive state with the local oscillator signal source 825 at its minimum magnitude.

In this circuit configuration of multifunction integrated circuit structure 100, the circuit functions as a direct or sub-harmonic down converter for signal mixing. When a high frequency signal source serves as the local oscillator signal source 825 and is injected into the terminal port 155, the output port 160 will serve in a capacity as an injection locked oscillator similar to that of FIG. 7. However, with the additional radio frequency signal source 810, the circuit structure of integrated circuit 100 will serve as a down-converter signal mixer such that the output signal at port 160 will have the following signal frequency components:

$m*f_0-n*f_1$ where $m=1,2,3, \ldots$ and where $n=1,2,3, \ldots$
As before, the circuit configuration of FIG. 9 is such that the output power may be optimized by mechanically tuning the open stub resonator 147.

It should be recognized that the details of the circuit configurations depicted in FIGS. 4–8 have been provided so as to offer a description of several of the many circuit functions which may be achieved employing the novel multifunction integrated circuit structure of the present invention. These details may, of course, be altered, and such variations are intended to be within the true spirit and scope of the present invention.

The description of the present invention has set forth a novel multifunction integrated circuit structure which may be fabricated by low cost and reliable production techniques commonly referred to as Monolithic Microwave Integrated Circuit (MMIC) technology. Although FIGS. 4–8 have mentioned particular components externally applied to the simple integrated circuit structure 100, these components may be fabricated directly on a single substrate embodying the same circuit configuration as depicted in the drawings and more particularly to FIG. 1, and such configurations are also intended to be within the true spirit and scope of the present invention.

Further, the invention has been described herein in considerable detail in order to comply with the Patent Statutes and to provide those skilled in the art with the information needed to apply the novel principles of the present invention, and to construct and use such exemplary and specialized components as are required. However, it is to be understood that the invention may be carried out by specifically different equipment and devices, and that various modifications, both as to the equipment details and operating procedures, may be accomplished without departing from the true spirit and scope of the present invention.

More specifically, although the present invention has been illustrated by way of employing an oscillator circuit employing a single field-effect transistor with other associated components, an alternate design is of course possible. Such designs may include additional transistors and associated components in order to achieve the oscillator circuit function of the present invention. Similarly, although the present invention has been illustrated by way of employing a buffer amplifier circuit employing a single field-effect transistor with other associated components, an alternate design is of course possible. Such designs may include additional transistors and associated components in order to achieve the buffer amplifier function of the present invention. Accordingly, such variations of both the oscillator design and buffer amplifier design are also intended to be within the true spirit and scope of the present invention.

We claim:

1. A multifunction high frequency integrated circuit structure comprising:
   (i) a resonator circuit means including an amplifier means having a control input terminating means and an output means;
   (ii) first and second transmission line segments each having a selected length, and arranged so as to form a first stripline coupler;
       (a) said first transmission line segment having a first terminating end electrically connected to said control input terminating means of said amplifier means, and a second terminating end, and
       (b) said second transmission line segment having opposing first and second terminating ends;
   (iii) third and fourth transmission line segments each having a selected length, and arranged so as to form a second stripline coupler, and
       (a) said third transmission line segment having a first terminating end electrically connected to said output means of said first amplifier means, and a second terminating end, and
       (b) said fourth transmission line segment having opposing first and second terminating ends; and
   (iv) a second amplifier means having a control input means electrically connected to said first terminating end of said fourth transmission line segment of said second transmission line strip coupler, and an output means.

2. The circuit structure of claim 1 wherein:
   each of said first and second amplifier means includes at least one field effect transistor having a gate input region, and drain and source regions; and
   wherein said circuit structure further includes,
   gate bias terminal means for receiving a gate bias potential source relative to said ground plane, said gate bias terminal means electrically coupled to each of said gate regions of said first and second amplifier means; and
   drain bias terminal means for receiving a drain bias potential source relative to said ground plane, said drain bias terminal means electrically coupled to said drain region of each of said first and second amplifier means.

3. The circuit structure of claim 2 further comprising:
   a first resistor means electrically connected in shunt through a via between said ground plane and said first terminating end of said second transmission line segment; and
   a second resistor means electrically connected in series between said ground plane and said source region, though a via.

4. The circuit structure of claim 3 further comprising:
   a fifth transmission line segment having first terminating end electrically connected to said source region; and a sixth transmission line segment electrically connected in series with said second resistor, and wherein said sixth transmission line segment is electrically connected to fifth transmission line segment first terminating end.

5. The circuit structure of claim 1 wherein:

said first transmission line segment includes means for selectively tuning said resonator circuit so as to provide an output signal at said output means of said second amplifier means at a selected center frequency;

said control input terminating means is electrically coupled to said ground plane through a selected resistive load such that said center frequency varies in relation to said gate bias potential; and said control input terminating means is electrically connected to a variable potential source.

6. The circuit structure of claim 1 wherein:

said control input terminating means is electrically coupled to said ground plane through a combination selected resistive load and high-Q resonance cavity such that said center frequency exhibits low phase noise; and said control input terminating means is electrically connected to a variable potential source.

7. The circuit structure of claim 1 wherein:

said first transmission line segment includes tuning means for selectively tuning said resonator circuit so as to provide an output signal at said output means of said second amplifier means at a selected center frequency; and said control input terminating means is electrically coupled to said ground plane through a signal source such that said output signal exhibits harmonic components of said center frequency.

8. The circuit structure of claim 1 wherein:

said first transmission line segment includes tuning means for selectively optimizing said resonator circuit so as to provide an output signal at said output means of said second amplifier means at a selected center frequency;

said control input terminating means is electrically coupled to said ground plane through a selected resistive load; and said second terminating means of said second transmission line segment of said first strip coupler is electrically connected to a low power signal source at a control frequency such that said center frequency is locked in frequency and phase to said control frequency.

9. The circuit structure of claim 1 wherein:

said first transmission line segment includes means for selectively tuning said resonator circuit so as to provide an output signal at said output means of said second amplifier means at a selected center frequency;

said control input terminating means is electrically coupled to said ground plane through a first frequency signal source at frequency $f_1$; and said second terminating end of said second transmission line segment of said first strip coupler is electrically connected to a second frequency signal source at frequency $f_0$ such that said center frequency exhibits frequency components mathematically described by:

$m*f_0 \pm n*f_1$ where $m=1,2,3,\ldots$ and where $n=0,1,2,3,\ldots$.

* * * * *